(12) United States Patent
Nagoya

(10) Patent No.: US 12,316,301 B2
(45) Date of Patent: May 27, 2025

(54) PIEZOELECTRIC RESONATOR PLATE AND PIEZOELECTRIC RESONATOR DEVICE

(71) Applicant: DAISHINKU CORPORATION, Kakogawa (JP)

(72) Inventor: Wataru Nagoya, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 877 days.

(21) Appl. No.: 17/608,153

(22) PCT Filed: May 28, 2020

(86) PCT No.: PCT/JP2020/021219
§ 371 (c)(1),
(2) Date: Nov. 2, 2021

(87) PCT Pub. No.: WO2020/241790
PCT Pub. Date: Dec. 3, 2020

(65) Prior Publication Data
US 2022/0294418 A1 Sep. 15, 2022

(30) Foreign Application Priority Data

May 31, 2019 (JP) ................................. 2019-102950
May 31, 2019 (JP) ................................. 2019-102951
Jun. 21, 2019 (JP) ................................. 2019-115542

(51) Int. Cl.
*H03H 9/19* (2006.01)
*H03H 9/10* (2006.01)
*H03H 9/13* (2006.01)

(52) U.S. Cl.
CPC ............ *H03H 9/19* (2013.01); *H03H 9/1035* (2013.01); *H03H 9/132* (2013.01)

(58) Field of Classification Search
CPC ......... H03H 9/19; H03H 9/1035; H03H 9/132
(Continued)

(56) References Cited

U.S. PATENT DOCUMENTS

2010/0327705 A1* 12/2010 Koyama ................... H03H 9/19
310/365
2010/0327706 A1* 12/2010 Mizusawa ............ H03H 9/0595
310/365
(Continued)

FOREIGN PATENT DOCUMENTS

CN 101772889 A 7/2010
JP 2010-252051 A 11/2010
(Continued)

*Primary Examiner* — Derek J Rosenau
(74) *Attorney, Agent, or Firm* — METROLEX IP LAW GROUP, PLLC; Robert L. Scott, Esq.

(57) ABSTRACT

A crystal resonator plate according to one or more embodiments may include: a vibrating part; an external frame part surrounding the outer periphery of the vibrating part; and a support part connecting the vibrating part to the external frame part. A first excitation electrode is formed on a first main surface of the vibrating part. A second excitation electrode is formed on a second main surface of the vibrating part. The second excitation electrode includes a pair of parallel sides parallel to each other. The first excitation electrode includes protruding parts that protrude outward from a part between the parallel sides the second excitation electrode in plan view. The protruding parts each have an outer edge shape that is not along the parallel sides in plan view.

14 Claims, 8 Drawing Sheets

(58) Field of Classification Search
USPC .................................................. 310/344, 348
See application file for complete search history.

(56) References Cited

U.S. PATENT DOCUMENTS

| | | |
|---|---|---|
| 2011/0215678 A1 | 9/2011 | Kohda et al. |
| 2012/0133248 A1* | 5/2012 | Kusano ................ H03H 9/0547 |
| | | 310/348 |
| 2013/0043959 A1* | 2/2013 | Ishii ..................... H03H 9/0542 |
| | | 331/158 |
| 2014/0047687 A1 | 2/2014 | Kohda et al. |
| 2019/0229704 A1 | 7/2019 | Morimoto et al. |

FOREIGN PATENT DOCUMENTS

| | | |
|---|---|---|
| JP | 2011-160094 A | 8/2011 |
| JP | 5104867 B2 | 12/2012 |
| JP | 2017-153033 A | 8/2017 |
| WO | 2018/042994 A1 | 3/2018 |

* cited by examiner

PIEZOELECTRIC RESONATOR PLATE AND PIEZOELECTRIC RESONATOR DEVICE

TECHNICAL FIELD

The present invention relates to a piezoelectric resonator plate and a piezoelectric resonator device including the piezoelectric resonator plate.

BACKGROUND ART

A piezoelectric resonator device (for example, a piezoelectric resonator and a piezoelectric oscillator) including a piezoelectric resonator plate such as an AT-cut crystal resonator plate that causes thickness shear vibration has a configuration in which a pair of excitation electrodes is formed on the front and rear surfaces of the piezoelectric resonator plate in a manner of facing each other so that alternating-current (AC) voltage is applied to the excitation electrodes. Recently, the operating frequency of the piezoelectric resonator device has increased (for example, the frequency of about 150 MHz), which may be accompanied with spurious vibration in the vicinity of the main vibration of the piezoelectric resonator device. Such emission may affect the properties of the piezoelectric resonator device. It is a conventionally known technique that a pair of excitation electrodes of the piezoelectric resonator plate is arranged so as to be displaced from each other for reducing the spurious vibration (for example, see Patent Document 1).

Also, a piezoelectric resonator plate is conventionally known, which includes: a vibrating part; an external frame part surrounding the outer periphery of the vibrating part; and a support part connecting the vibrating part to the external frame part (for example, see Patent Document 1). In such a piezoelectric resonator plate having a frame body in which the vibrating part is connected to the external frame part via the support part, both of the pair of excitation electrodes are formed to have substantially the same shape (principally, a rectangle shape) and furthermore located at substantially the same position in plan view. Therefore, it cannot be said that enough measures are taken for reducing the spurious vibration.

PRIOR ART DOCUMENTS

Patent Documents

[Patent Document 1] JP 5104867
[Patent Document 2] JP2010-252051 A

SUMMARY OF THE INVENTION

Problem to be Solved by the Invention

The present invention was made in consideration of the above circumstances, an object of which is to provide a piezoelectric resonator plate having a frame body in which a vibrating part is connected to an external frame part via a support part, and also a piezoelectric resonator device including the piezoelectric resonator plate, in which spurious vibration is reduced and thus electrical properties are improved.

Means for Solving the Problem

As a configuration to solve the above problems, the present invention provides a piezoelectric resonator plate that operates in a thickness shear vibration mode, which includes: a vibrating part; an external frame part surrounding an outer periphery of the vibrating part; a support part connecting the vibrating part to the external frame part; a cutout part formed between the vibrating part and the external frame part by cutting out the piezoelectric resonator plate; a first excitation electrode formed on a first main surface of the vibrating part; and a second excitation electrode formed on a second main surface of the vibrating part, which makes a pair with the first excitation electrode. At least one protruding part is provided on one excitation electrode of the first excitation electrode and the second excitation electrode so as to protrude with respect to the other excitation electrode of the first excitation electrode and the second excitation electrode in plan view. The other excitation electrode includes at least one pair of parallel sides parallel to each other. The at least one protruding part protrudes outward from a part between the pair of parallel sides in plan view, and furthermore has an outer edge shape that is not along the pair of parallel sides in plan view.

With the above-described configuration, the protruding part of the one excitation electrode has an outer edge shape that is not along the parallel sides of the other excitation electrode in plan view. Thus, it is possible to reduce spurious vibration due to the outer edge shape of the one excitation electrode. In this way, it is possible to reduce spurious vibration and thus improve electrical properties of the piezoelectric resonator plate having a frame body in which the vibrating part is connected to the external frame part via the support part. Especially in the piezoelectric resonator plate having a frame body in which the vibrating part is connected to the external frame part via the support part, no mechanical and electrical connection point is directly formed on the vibrating part in a process after forming the vibrating part, which results in no spurious vibration being generated due to formation of the connection point. That is, it is possible to further prevent spurious vibration from being generated due to the process after forming the vibrating part in addition to reduction of spurious vibration by the excitation electrodes. Furthermore in this piezoelectric resonator plate having a frame body, since the excitation electrodes can be formed on the vibrating part without taking into account the connection point, it is possible to increase flexibility in the design of the excitation electrodes, which leads to easy adjustment of the size and the position of the electrodes. In particular, it is possible to enhance electrical properties by forming the excitation electrodes having further large size, or to reduce generation of an asymmetric vibration mode that causes spurious vibration by arranging the excitation electrodes such that the respective centers thereof substantially coincide with the center of the vibrating part in plan view.

Also, the present invention provides a piezoelectric resonator plate that operates in a thickness shear vibration mode, which includes: a vibrating part; an external frame part surrounding an outer periphery of the vibrating part; a support part connecting the vibrating part to the external frame part; a cutout part formed between the vibrating part and the external frame part by cutting out the piezoelectric resonator plate; a first excitation electrode formed on a first main surface of the vibrating part; and a second excitation electrode formed on a second main surface of the vibrating part, which makes a pair with the first excitation electrode. The first excitation electrode and the second excitation electrode are each formed to have a line-symmetric shape with respect to a straight line parallel to an X axis of the piezoelectric resonator plate. At least one protruding part is provided on one excitation electrode of the first excitation electrode and the second excitation electrode so as to protrude outward without being superimposed on the other excitation electrode of the first excitation electrode and the second excitation electrode in plan view. The at least one protruding part has an outer edge shape that is not along the X axis in plan view.

With the above-described configuration, the protruding part of the one excitation electrode has an outer edge shape that is not along the X axis in plan view. Thus, it is possible to reduce spurious vibration due to the outer edge shape of the one excitation electrode. In this way, it is possible to reduce spurious vibration and thus improve electrical properties of the piezoelectric resonator plate having a frame body in which the vibrating part is connected to the external frame part via the support part. Especially in the piezoelectric resonator plate having a frame body in which the vibrating part is connected to the external frame part via the support part, no mechanical and electrical connection point is directly formed on the vibrating part in a process after forming the vibrating part, which results in no spurious vibration being generated due to formation of the connection point. That is, it is possible to further prevent spurious vibration from being generated due to the process after forming the vibrating part in addition to reduction of spurious vibration by the excitation electrodes. Furthermore in this piezoelectric resonator plate having a frame body, since the excitation electrodes can be formed on the vibrating part without taking into account the connection point, it is possible to increase flexibility in the design of the excitation electrodes, which leads to easy adjustment of the size and the position of the electrodes. In particular, it is possible to enhance electrical properties by forming the excitation electrodes having further large size, or to reduce generation of an asymmetric vibration mode that causes spurious vibration by arranging the excitation electrodes such that the respective centers thereof substantially coincide with the center of the vibrating part in plan view.

In the above-described configuration, it is preferable that a position where a centroid of the one excitation electrode is disposed substantially coincides with a position where a centroid of the other excitation electrode is disposed in plan view. With this configuration, it is possible to form the protruding parts of the one excitation electrode so as to have a line-symmetric shape with respect to the straight line that passes through the centroid of the one excitation electrode and that is parallel to the X axis. In this way, it is possible to reduce spurious vibration derived from asymmetry between the protruding parts of the one excitation electrode.

Also, the present invention provides a piezoelectric resonator plate that operates in a thickness shear vibration mode, which includes: a vibrating part; an external frame part surrounding an outer periphery of the vibrating part; a support part connecting the vibrating part to the external frame part; a cutout part formed between the vibrating part and the external frame part by cutting out the piezoelectric resonator plate; a first excitation electrode formed on a first main surface of the vibrating part; and a second excitation electrode formed on a second main surface of the vibrating part, which makes a pair with the first excitation electrode. A position where a centroid of the first excitation electrode is disposed substantially coincides with a position where a centroid of the second excitation electrode is disposed in plan view. One excitation electrode of the first excitation electrode and the second excitation electrode is disposed so as to tilt with respect to the other excitation electrode of the first excitation electrode and the second excitation electrode in plan view.

With the above-described configuration, the one excitation electrode is disposed so as to tilt with respect to the other excitation electrode in plan view. Thus, it is possible to reduce spurious vibration due to the outer edge shape of the one excitation electrode. In this way, it is possible to reduce spurious vibration and thus improve electrical properties of the piezoelectric resonator plate having a frame body in which the vibrating part is connected to the external frame part via the support part. Especially in the piezoelectric resonator plate having a frame body in which the vibrating part is connected to the external frame part via the support part, no mechanical and electrical connection point is directly formed on the vibrating part in a process after forming the vibrating part, which results in no spurious vibration being generated due to formation of the connection point. That is, it is possible to further prevent spurious vibration from being generated due to the process after forming the vibrating part in addition to reduction of spurious vibration by the excitation electrodes. Furthermore in this piezoelectric resonator plate having a frame body, since the excitation electrodes can be formed on the vibrating part without taking into account the connection point, it is possible to increase flexibility in the design of the excitation electrodes, which leads to easy adjustment of the size and the position of the electrodes. In particular, it is possible to enhance electrical properties by forming the excitation electrodes having further large size, or to reduce generation of an asymmetric vibration mode that causes spurious vibration by arranging the excitation electrodes such that the respective centers thereof substantially coincide with the center of the vibrating part in plan view. Here, the expression "dispose so as to tilt" includes the states in which: one excitation electrode is rotated with respect to the other excitation electrode; one excitation electrode is displaced (slid) from the other excitation electrode; one excitation electrode has a protruding part with respect to the other excitation electrode; and one excitation electrode is elongated or contracted relative to the other excitation electrode.

In the above-described configuration, it is preferable that protruding parts are respectively provided on both sides of the one excitation electrode with the centroid of the first excitation electrode being interposed between both the sides such that the protruding parts protrude outward without being superimposed on the other excitation electrode in plan view. Also, it is preferable that the protruding parts each have an outer edge shape that is not along an outer edge of the other excitation electrode in plan view. With this configuration, the protruding parts that are respectively provided on both sides of the one excitation electrode with the centroid of the first excitation electrode being interposed therebetween each have an outer edge shape that is not along the outer edge of the other excitation electrode in plan view. Thus, it is possible to reduce spurious vibration due to the outer edge shape of the one excitation electrode. Furthermore, the position where a centroid of the one excitation electrode is disposed substantially coincides with the position where a centroid of the other excitation electrode is disposed in plan view. Thus, it is possible to form the protruding parts of the one excitation electrode so as to have a line-symmetric shape with respect to the straight line that passes through the centroid of the one excitation electrode and that is parallel to the outer edge of the other excitation electrode. In this way, it is possible to reduce spurious vibration derived from asymmetry between the protruding parts of the one excitation electrode.

In the above-described configuration, it is preferable that an area of the other excitation electrode is larger than an area of the one excitation electrode. With this configuration, it is possible to easily adjust the frequency of the piezoelectric resonator plate by performing, for example, ion beam etching on the other excitation electrode having a larger area. Conventionally in the piezoelectric resonator plate having a frame body in which the vibrating part is connected to the external frame part via the support part, the first excitation electrode and the second excitation electrode are formed so as to have substantially the same shape (principally, a rectangle shape) and furthermore to locate at substantially the same position in plan view, as described above. However, by forming the first excitation electrode and the second excitation electrode so as to have respectively different areas, a region for frequency adjustment can be ensured on the other excitation electrode having a larger area, thus this configuration has an advantage in frequency adjustment of the piezoelectric resonator plate. When the area of the other excitation electrode is smaller than the area of the one excitation electrode, the CI value at ambient temperature of the piezoelectric resonator plate may rise or the CI value may unstably change depending on temperature change. However, by forming the area of the other excitation electrode larger than the area of the one excitation electrode, it is possible to maintain good properties (e.g. the CI value at ambient temperature and temperature properties of the CI value) of the piezoelectric resonator plate.

In the above-described configuration, it is preferable that a first lead-out wiring is formed on a first main surface of the support part so as to be connected to the first excitation electrode and a second lead-out wiring is formed on a second main surface of the support part so as to be connected to the second excitation electrode, and also it is preferable that the first lead-out wiring and the second lead-out wiring extend in the same direction. With this configuration, since the first lead-out wiring and the second lead-out wiring extend in the same direction, it is possible to simplify the first and second lead-out wirings as well as wirings to be connected to the first and second lead-out wirings, compared to the case in which the first and second lead-out wirings extend respectively in the different directions. As a result, no complicated wiring is required, which contributes to size reduction of the piezoelectric resonator plate.

In the above-described configuration, it is preferable that one lead-out wiring of the first lead-out wiring and the second lead-out wiring is disposed so as to be displaced from the other lead-out wiring of the first lead-out wiring and the second lead-out wiring in plan view. A part where the first and second lead-out wirings are superimposed on each other may generate vibration, which may lead to vibration leakage to the external frame part. Therefore, by reducing the part where the first and second lead-out wirings are superimposed on each other as much as possible, it is possible to reduce the vibration generated in the first and second lead-out wirings, which leads to prevention of vibration leakage to the external frame part.

In the above-described configuration, it is preferable that the one excitation electrode is formed so as to have a rhombus shape, and the other excitation electrode is formed so as to have a rectangle shape. With this configuration, the whole outer edge of the one excitation electrode is not along the X axis in plan view. In this way, it is possible to further effectively reduce spurious vibration due to the outer edge shape of the one excitation electrode. Conventionally in the piezoelectric resonator plate having a frame body in which the vibrating part is connected to the external frame part via the support part, the first excitation electrode and the second excitation electrode are formed so as to have substantially the same shape (principally, a rectangle shape) and furthermore to locate at substantially the same position in plan view. However, by forming the other excitation electrode having a rectangle shape, frequency adjustment of the piezoelectric resonator plate can be performed using masks and jigs for rectangle electrodes, similarly to the conventional cases. Thus, this configuration has an advantage in frequency adjustment.

In the above-described configuration, it is preferable that the piezoelectric resonator plate includes only one support part. With this configuration, it is possible to reduce vibration leakage from the vibrating part to the external frame part via the support part as much as possible. Thus, the vibrating part can be piezoelectrically vibrated further effectively, which leads to improvement of the electrical properties.

Also, the present invention provides a piezoelectric resonator device including the piezoelectric resonator plate having the features as described above. The piezoelectric resonator device includes: a first sealing member covering the first excitation electrode of the piezoelectric resonator plate; and a second sealing member covering the second excitation electrode of the piezoelectric resonator plate. The vibrating part of the piezoelectric resonator plate is hermetically sealed by bonding the first sealing member to the piezoelectric resonator plate and by bonding the second sealing member to the piezoelectric resonator plate. With the piezoelectric resonator device including the piezoelectric resonator plate having the above-described configuration, it is possible to obtain functions and effects similar to those of the piezoelectric resonator plate as described above.

Effect of the Invention

With the present invention, the protruding part of one excitation electrode has an outer edge shape that is not along the parallel sides of the other excitation electrode in plan view. Thus, it is possible to reduce spurious vibration due to the outer edge shape of the one excitation electrode. In this way, it is possible to reduce spurious vibration and thus improve electrical properties of the piezoelectric resonator plate having a frame body in which the vibrating part is connected to the external frame part via the support part.

MEANS FOR CARRYING OUT THE INVENTION

Hereinafter, an embodiment of the present invention will be described in detail with reference to the drawings. In the following embodiment, a piezoelectric resonator device to which the present invention is applied is a crystal resonator.

Figure 1:
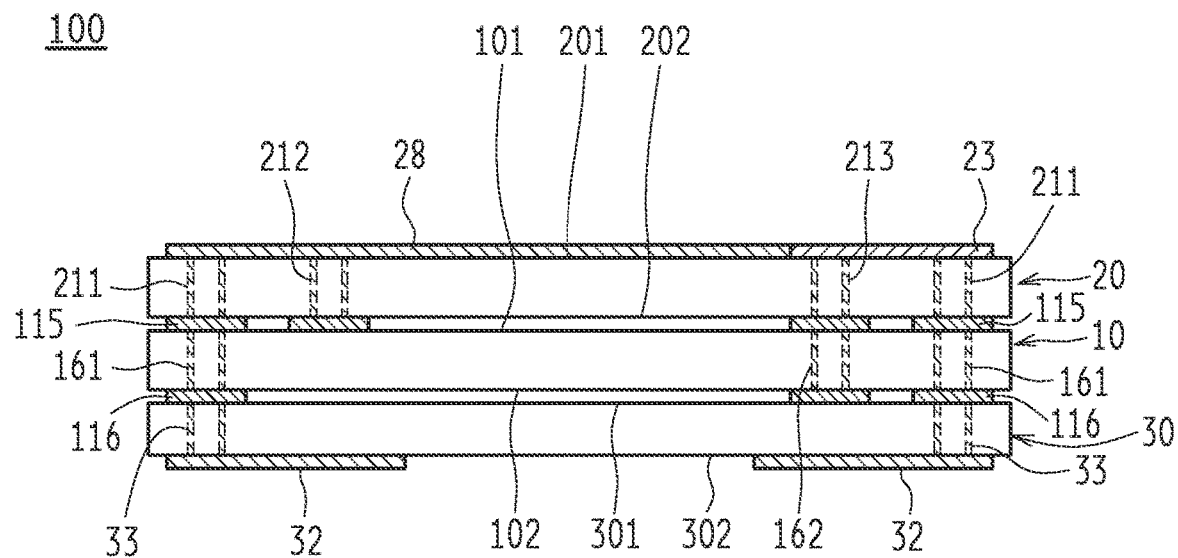
FIG. 1 is a schematic configuration diagram schematically illustrating a configuration of a crystal resonator according to an embodiment.

First, the basic configuration of a crystal resonator 100 according to this embodiment is described. As shown in FIG. 1, the crystal resonator 100 includes: a crystal resonator plate (piezoelectric resonator plate) 10; a first sealing member 20; and a second sealing member 30. In this crystal resonator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. In the crystal resonator 100, the first sealing member 20 and the second sealing member 30 are bonded to respective main surfaces of the crystal resonator plate 10, thus an internal space (cavity) of the package is formed. In this internal space, a vibrating part 11 (see FIGS. 4 and 5) is hermetically sealed.

The crystal resonator 100 according to this embodiment has, for example, a package size of 1.0×0.8 mm, which is reduced in size and height. According to the size reduction, no castellation is formed in the package. Through holes (described later) are used for conduction between electrodes. The crystal resonator 100 is electrically connected to an external circuit board (not shown) provided outside via solder.

Next, the respective components of the above-described crystal resonator 100 (i.e. the crystal resonator plate 10, the first sealing member 20 and the second sealing member 30) are described with reference to FIGS. 1 to 7. Here, each of the components is described as a single body without being bonded. FIGS. 2 to 7 merely show respective configuration examples of the crystal resonator plate 10, the first sealing member 20 and the second sealing member 30, and thus the present invention is not limited thereto.

Figure 4:
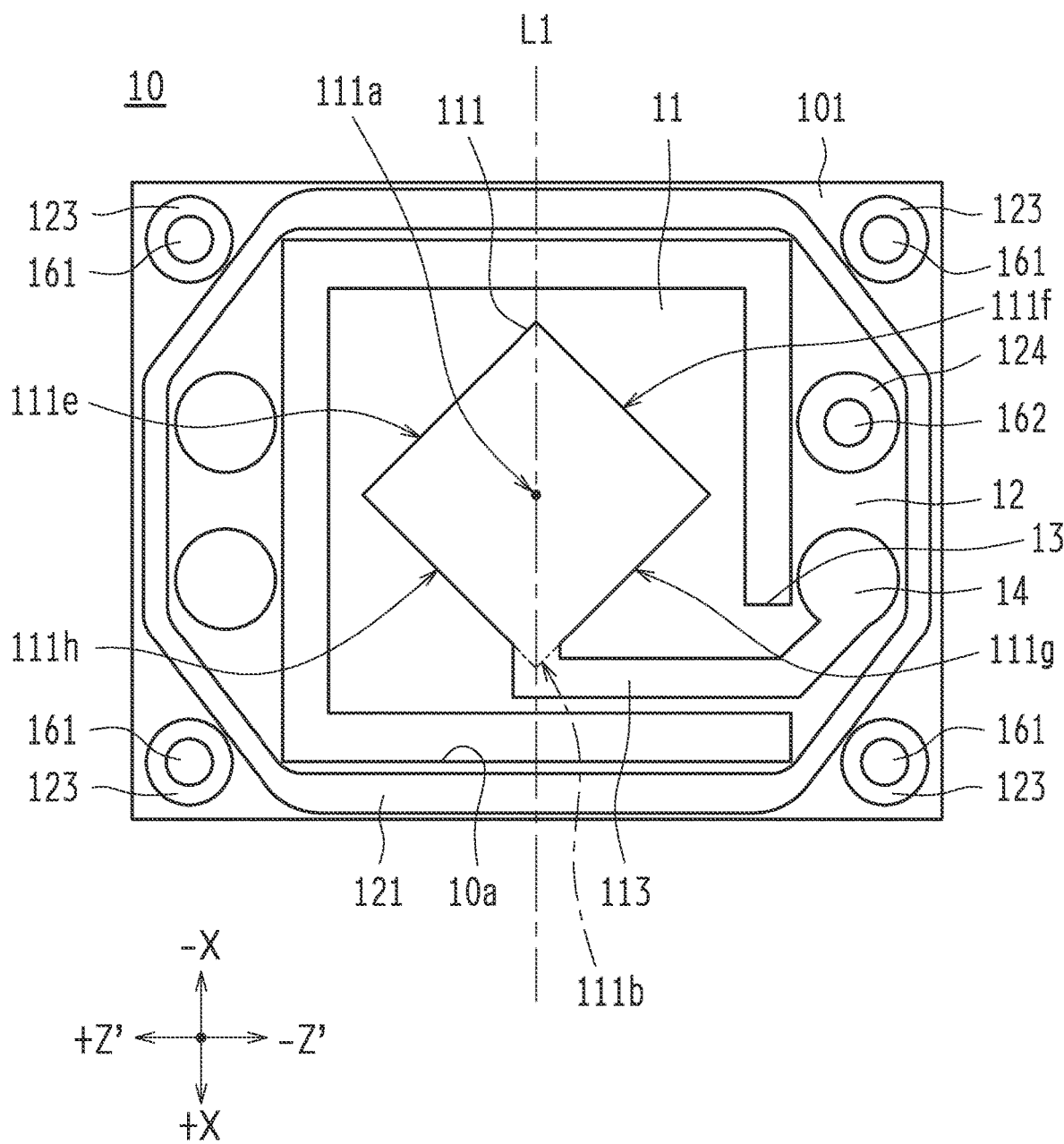
FIG. 4 is a schematic plan view illustrating a first main surface of a crystal resonator plate according to the embodiment.
Figure 5:
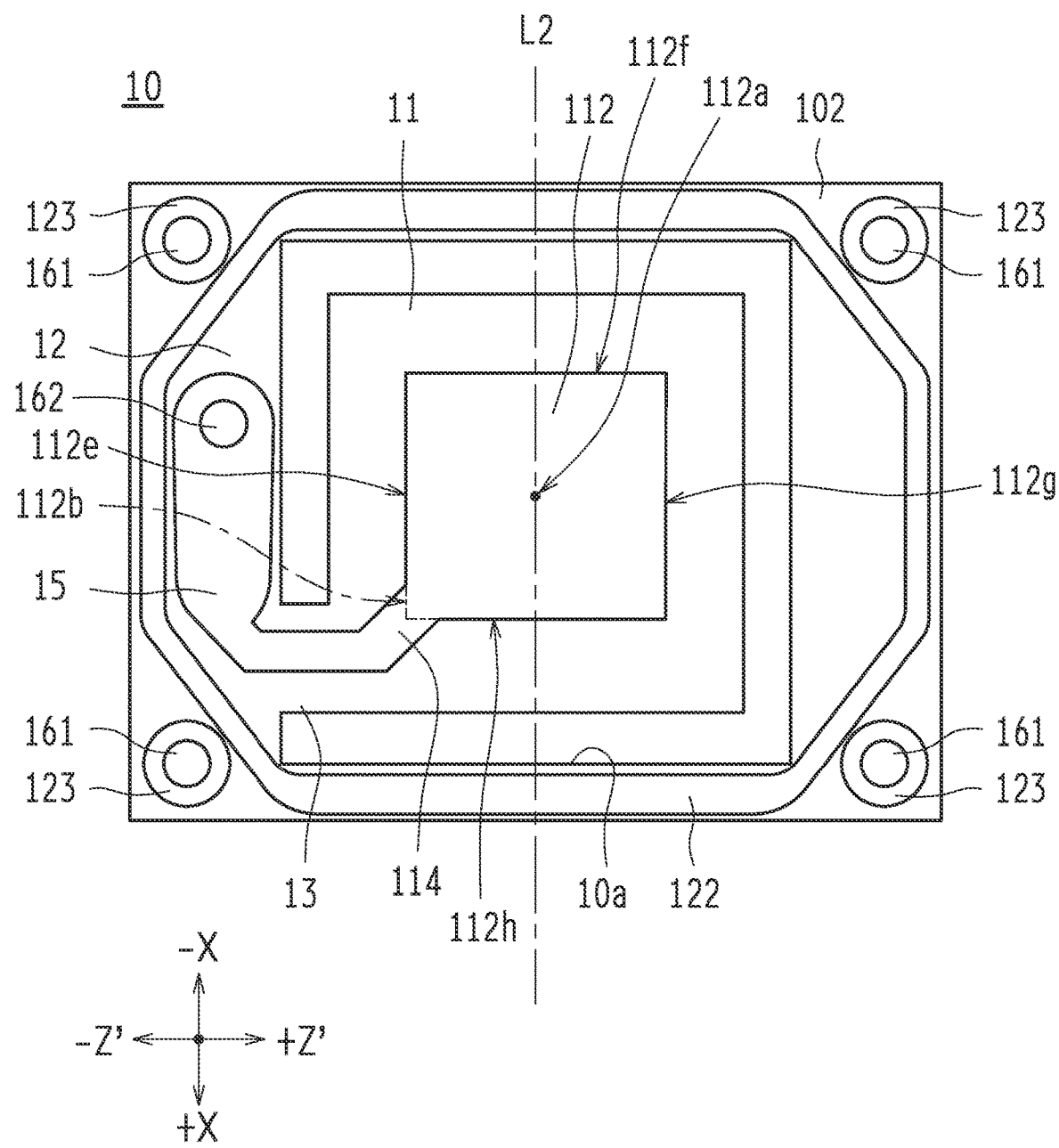
FIG. 5 is a schematic plan view illustrating a second main surface of the crystal resonator plate according to the embodiment.

The crystal resonator plate 10 according to this embodiment is a piezoelectric substrate made of crystal as shown in FIGS. 4 and 5. Each main surface (i.e. a first main surface 101 and a second main surface 102) is formed as a smooth flat surface (mirror-finished). In this embodiment, an AT-cut crystal plate that causes thickness shear vibration is used as the crystal resonator plate 10. In the crystal resonator plate 10 shown in FIGS. 4 and 5, each of the main surfaces 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by approximately 35° 15' from the Y axis and the Z axis out of the crystal axes of the crystal (this cutting angle may be changed to a certain extent within the range in which the frequency temperature characteristics of the AT-cut crystal resonator plate can be adjusted). The Y' axis direction and the Z' axis direction correspond to the directions in which the AT-cut crystal is cut out.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangle shape; an external frame part 12 surrounding the outer periphery of the vibrating part 11; and a support part 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction. Also, a cutout part 10a is provided between the vibrating part 11 and the external frame part 12 by cutting out the crystal resonator plate 10. In this embodiment, the crystal resonator plate 10 has only one support part 13 to connect the vibrating part 11 to the external frame part 12. The cutout part 10a is continuously formed so as to surround the outer periphery of the vibrating part 11.

The first excitation electrode 111 is provided on the first main surface 101 side of the vibrating part 11 while the second excitation electrode 112 is provided on the second main surface 102 side of the vibrating part 11. In this embodiment, the first excitation electrode (one excitation electrode) 111 is formed so as to have a rhombus shape while the second excitation electrode (the other excitation electrode) 112 is formed so as to have a square shape. The first excitation electrode 111 and the second excitation electrode 112 are respectively connected to lead-out wirings (first lead-out wiring 113 and second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13. The first and second excitation electrodes 111 and 112 are described in detail later.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 4 and 5, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 4 and 5, on the side of the −Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102. Respective center parts of the first through holes 161 and the second through hole 162 are hollow penetrating parts penetrating between the first main surface 101 and the second main surface 102.

Figure 2:
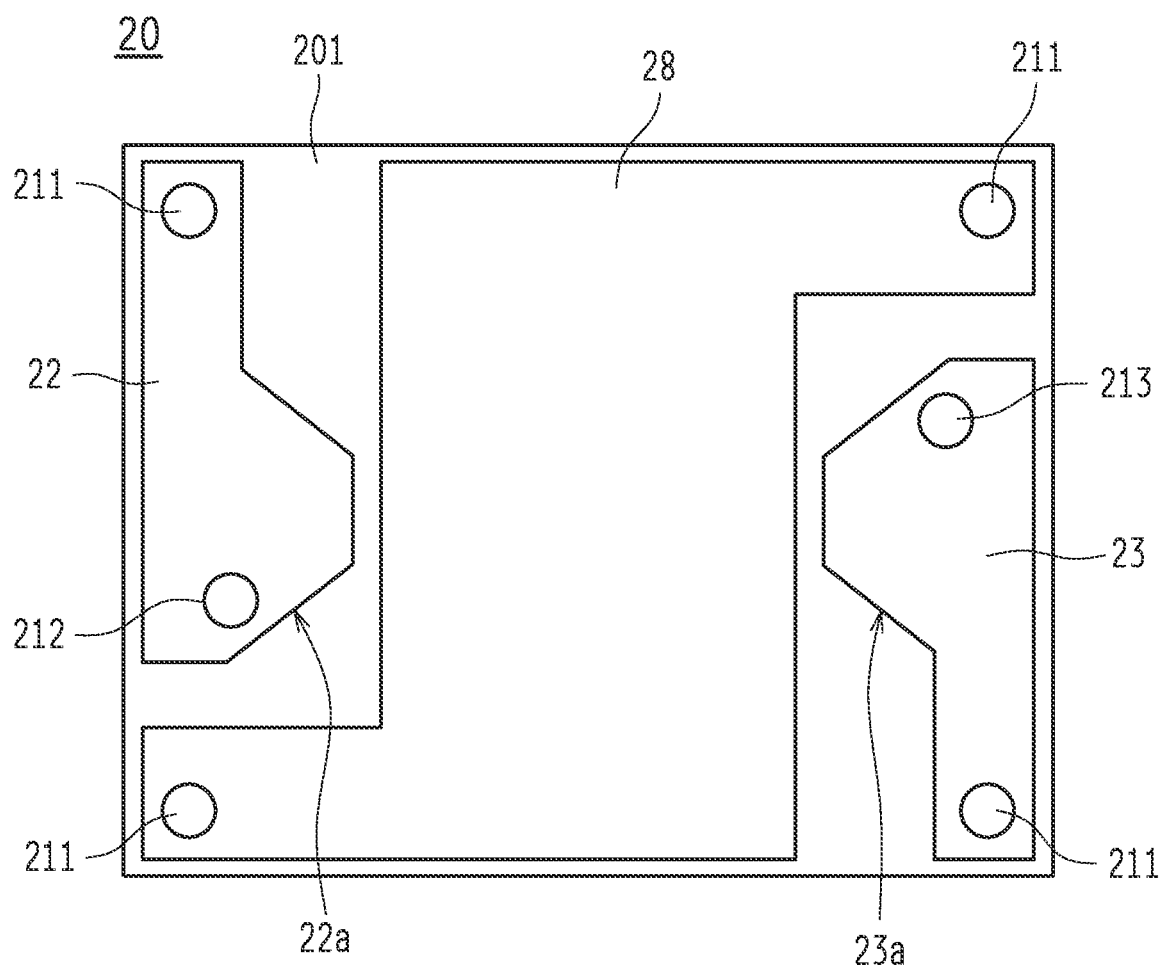
FIG. 2 is a schematic plan view illustrating a first main surface of a first sealing member of the crystal resonator.
Figure 3:
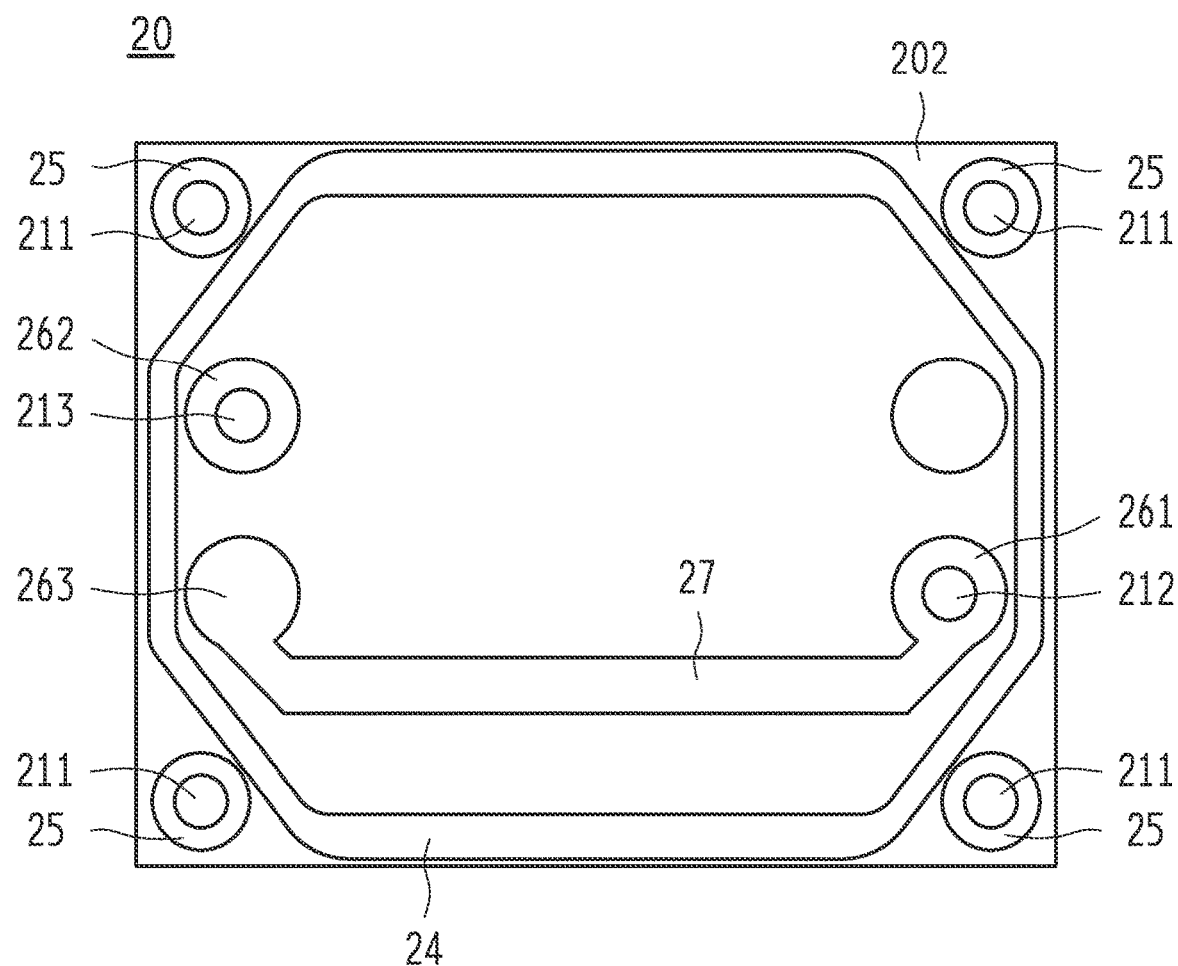
FIG. 3 is a schematic plan view illustrating a second main surface of the first sealing member of the crystal resonator.
Figure 3:
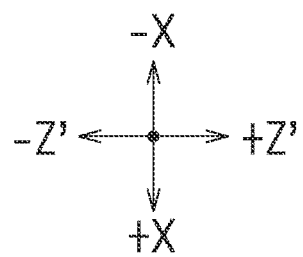

As shown in FIGS. 2 and 3, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal resonator 100. Furthermore, the respective directions of the X axis, Y axis and Z' axis of the first sealing member 20 are the same as those of the crystal resonator plate 10.

As shown in FIG. 2, a first metal film 22 and a second metal film 23 both for wiring and a third metal film 28 for sealing are formed on a first main surface 201 (the outer main surface not facing the crystal resonator plate 10) of the first sealing member 20. The first and second metal films 22 and 23 for wiring are provided as the wirings for electrically connecting the first and second excitation electrodes 111 and 112 of the crystal resonator plate 10 to external electrode terminals 32 of the second sealing member 30. The first and second metal films 22 and 23 are respectively provided on both end parts in the Z' direction. Specifically, the first metal film 22 is provided on the end part in the +Z' direction while the second metal film 23 is provided on the end part in the −Z' direction. The first and second metal films 22 and 23 are both formed so as to extend in the X axis direction. The first metal film 22 is formed so as to have a substantially rectangle shape, and has a protruding part 22a extending in the −Z' direction on the side in the +X direction of the first metal film 22. The second metal film 23 is formed so as to have a substantially rectangle shape, and has a protruding part 23a extending in the +Z' direction on the side in the −X direction of the second metal film 23.

The third metal film 28 is provided between the first metal film 22 and the second metal film 23 at a predetermined interval from both the first metal film 22 and the second metal film 23. The third metal film 28 is provided so as to cover almost whole the remaining area where the first metal film 22 and the second metal film 23 are not formed on the first main surface 201 of the first sealing member 20.

As shown in FIGS. 2 and 3, six through holes are formed in the first sealing member 20 so as to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 2 and 3.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective center parts of the third through holes 211 and the fourth and fifth through holes 212 and 213 are hollow penetrating parts penetrating between the first main surface 201 and the second main surface 202. The respective through electrodes of the two third through holes 211 and 211 that are diagonally positioned on the first main surface 201 of the first sealing member 20 (i.e. in FIGS. 2 and 3, the third through hole 211 positioned in the corner part in the +X direction and in the +Z' direction and the third through hole 211 positioned in the corner part in the −X direction and in the −Z' direction) are electrically connected via the third metal film 28. Also, the through electrode of the third through hole 211 positioned in the corner part in the −X direction and in the +Z' direction is electrically connected to the through electrode of the fourth through hole 212 via the first metal film 22. Furthermore, the through electrode of the third through hole 211 positioned in the corner part in the +X direction and in the −Z' direction is electrically connected to the through electrode of the fifth through hole 213 via the second metal film 23.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view. On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213.

Furthermore, a connection bonding pattern 263 is formed on the side opposite to the connection bonding pattern 261 in the long axis direction of the first sealing member 20 (i.e. on the side of the −Z' direction). The connection bonding pattern 261 and the connection bonding pattern 263 are connected to each other via a wiring pattern 27.

Figure 6:
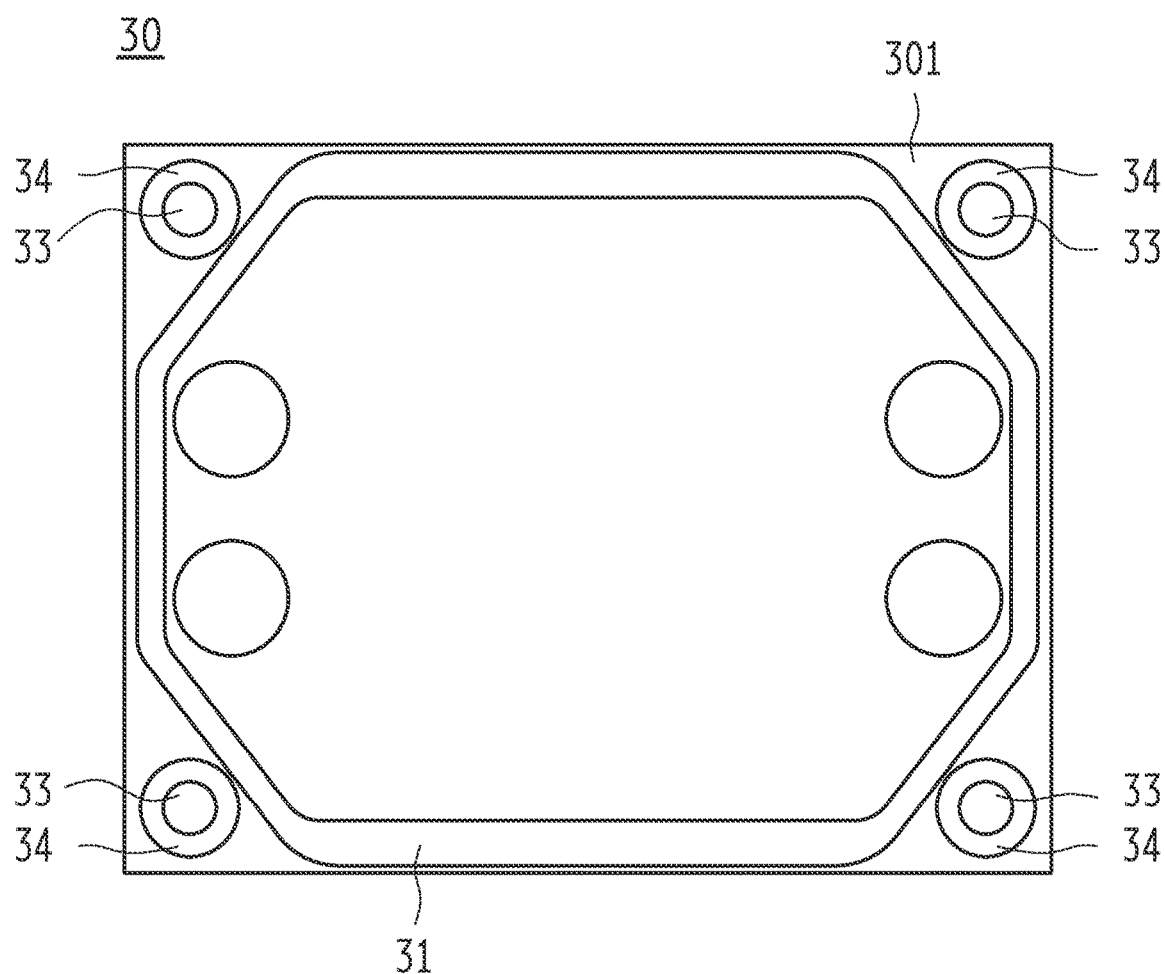
FIG. 6 is a schematic plan view illustrating a first main surface of a second sealing member of the crystal resonator.
Figure 7:
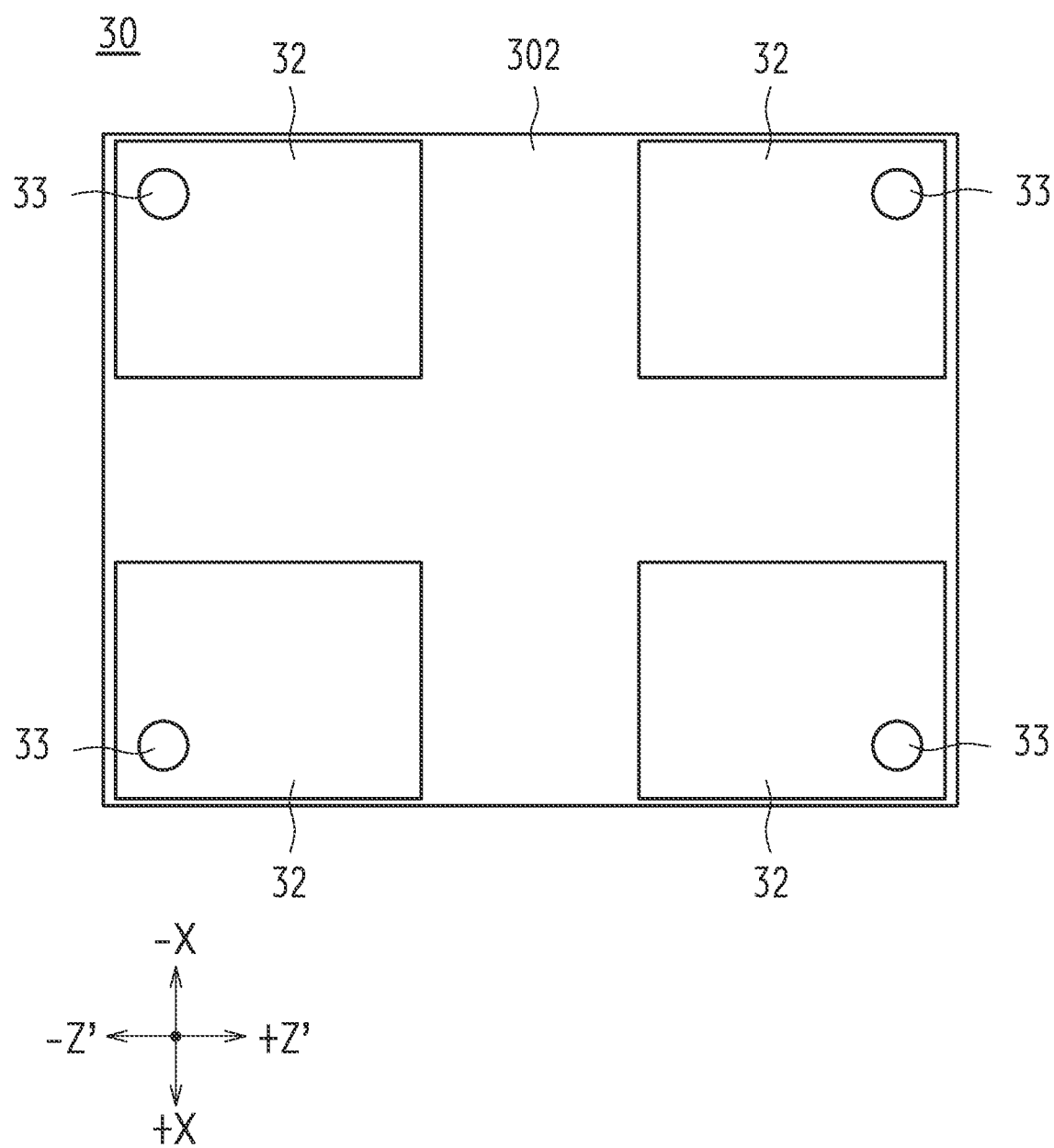
FIG. 7 is a schematic plan view illustrating a second main surface of the second sealing member of the crystal resonator.

As shown in FIGS. 6 and 7, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

On a second main surface 302 (the outer main surface not facing the crystal resonator plate 10) of the second sealing member 30, the four external electrode terminals 32 are formed, which are electrically connected to an external circuit board provided outside the crystal oscillator 100. The external electrode terminals 32 are respectively located on the four corners (corner parts) on the second main surface 302 of the second sealing member 30.

As shown in FIGS. 6 and 7, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes are respectively formed along a corresponding inner wall surface of the sixth through holes 33 so as to establish conduction between the electrodes formed on the first main surface 301 and the second main surface 302. In this way, the respective electrodes formed on the first main surface 301 are electrically conducted to the external electrode terminals 32 formed on the second main surface 302 via the through electrodes formed along the inner wall surfaces of the sixth through holes 33. Also, respective central parts of the sixth through holes 33 are hollow penetrating parts penetrating between the first main surface 301 and the second main surface 302. On the first main surface 301 of the second sealing member 30, connection bonding patterns 34 are respectively formed on the peripheries of the sixth through holes 33.

In the crystal resonator 100 including the crystal resonator plate 10, the first sealing member 20 and the second sealing member 30 as described above, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other. Thus, the package having the sandwich structure as shown in FIG. 1 is produced. Accordingly, the internal space of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112 and the external electrode terminals 32 of the crystal resonator 100. More specifically, the first excitation electrode 111 is connected to the external electrode terminal 32 via the first lead-out wiring 113, the wiring pattern 27, the fourth through hole 212, the first metal film 22, the third through hole 211, the first through hole 161 and sixth through hole 33 in this order. The second excitation electrode 112 is connected to the external electrode terminal 32 via the second lead-out wiring 114, the second through hole 162, the fifth through hole 213, the second metal film 23, the third through hole 211, the first through hole 161 and the sixth through hole 33 in this order. Also, the third metal film 28 is earth-connected (i.e. ground connection, using parts of the external electrode terminals 32) via the third through holes 211, the first through holes 161 and the sixth through holes 33 in this order.

In the crystal resonator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other wirings and electrodes formed on the crystal resonator 100 each preferably have the same configuration as the bonding patterns, which leads to patterning of the bonding patterns, the wirings and the electrodes at the same time.

In the above-described crystal resonator 100, sealing parts (seal paths) 115 and 116 that hermetically seal the vibrating part 11 of the crystal resonator plate 10 are formed so as to have an annular shape in plan view. The seal path 115 is formed by the diffusion bonding of the resonator-plate-side first bonding pattern 121 and the sealing-member-side first bonding pattern 24 as described above. The outer edge and the inner edge of the seal path 115 both have a substantially octagon shape. In the same way, the seal path 116 is formed by the diffusion bonding of the resonator-plate-side second bonding pattern 122 and the sealing-member-side second bonding pattern 31 as described above. The outer edge and the inner edge of the seal path 116 both have a substantially octagon shape.

In the crystal resonator 100 having the seal paths 115 and 116 formed by the diffusion bonding as described above, the first sealing member 20 and the crystal resonator plate 10 have a gap of not more than 1.00 μm. The second sealing member 30 and the crystal resonator plate 10 have a gap of not more than 1.00 μm. That is, the thickness of the seal path 115 between the first sealing member 20 and the crystal resonator plate 10 is not more than 1.00 μm, and the thickness of the seal path 116 between the second sealing member 30 and the crystal resonator plate 10 is not more than 1.00 μm (specifically, the thickness in the Au—Au bonding in this embodiment is 0.15 to 1.00 μm). As a comparative example, the conventional metal paste sealing material containing Sn has a thickness of 5 to 20 μm.

Figure 8:
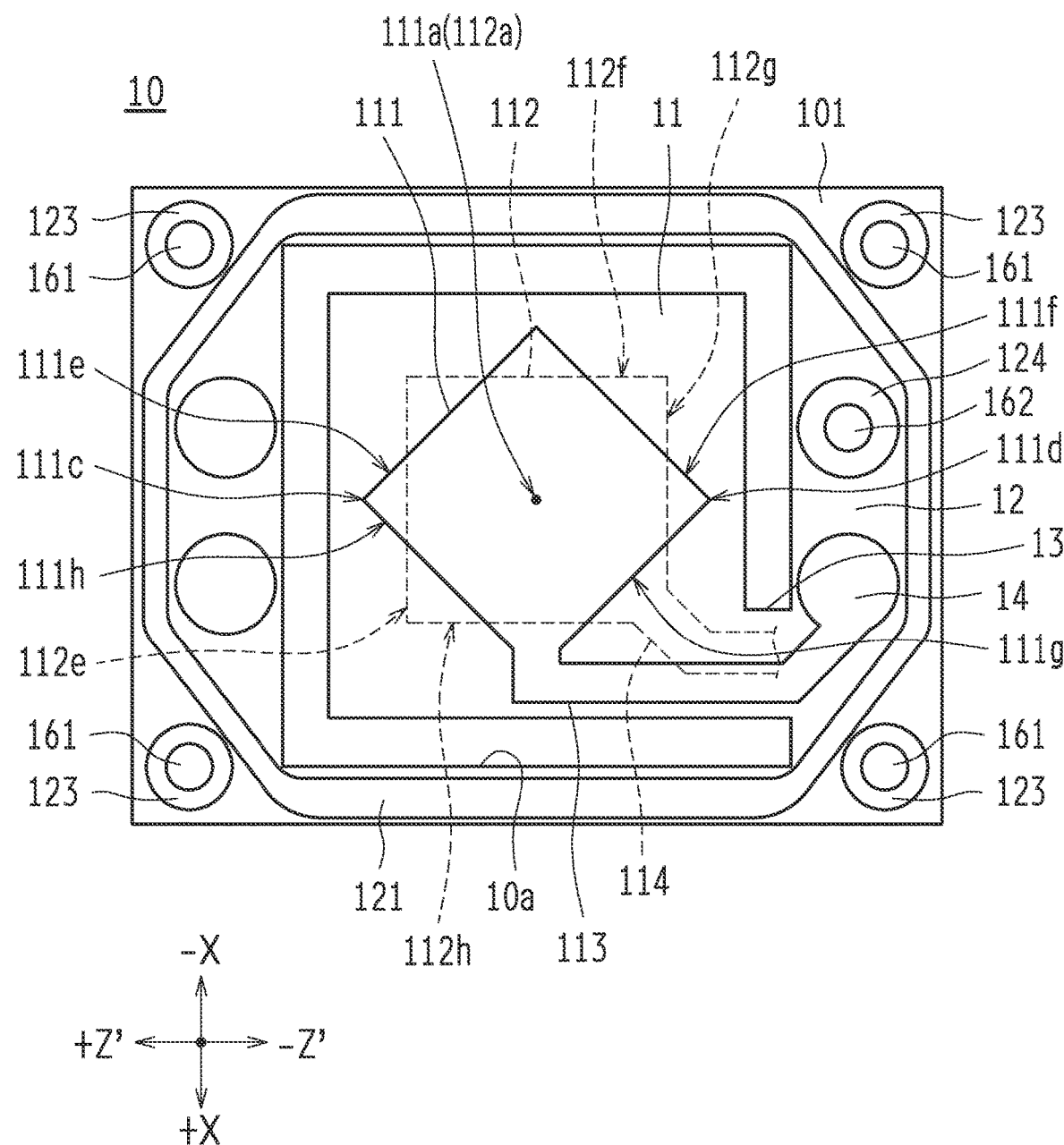
FIG. 8 is a schematic plan view illustrating a positional relationship among a first excitation electrode, a second excitation electrode, a first lead-out wiring, a second lead-out wiring and the like of the crystal resonator plate.

Here, a description is given on the first and second excitation electrodes 111 and 112 of the crystal resonator plate 10 according to this embodiment referring to FIGS. 4, 5 and 8.

In this embodiment, the first excitation electrode (one excitation electrode) 111 is formed so as to have a rhombus shape while the second excitation electrode (the other excitation electrode) 112 is formed so as to have a square shape, as described above. The first excitation electrode 111 has a line-symmetric shape with respect to a straight line L1 that passes through a centroid (center) 111a of the first excitation electrode 111 and that is parallel to the X axis. The second excitation electrode 112 has a line-symmetric shape with respect to a straight line L2 that passes through a centroid (center) 112a of the second excitation electrode 112 and that is parallel to the X axis. The position where the centroid 111a of the first excitation electrode 111 is disposed substantially coincides with the position where the centroid 112a of the second excitation electrode 112 is disposed in plan view.

Also, the area of the square-shaped second excitation electrode 112 is larger than the area of the rhombus-shaped first excitation electrode 111. The second excitation electrode 112 includes at least one pair of parallel sides 112e and 112g that are parallel to each other out of its four sides 111e, 111f, 111g and 111h. The parallel sides 112e and 112g extend in parallel with the X axis. The first excitation electrode 111 includes at least one protruding part that is not completely superimposed on the second excitation electrode 112 in plan view and protrudes outward from the part between the parallel sides 112e and 112g (i.e. the part sandwiched by the parallel sides 112e and 112g). In this embodiment, the first excitation electrode 111 is provided with a protruding part 111c protruding outward (in the +Z' direction) from the one side 112e disposed in the +Z' direction out of the parallel sides 112e and 112g of the second excitation electrode 112, and a protruding part 111d protruding outward (in the −Z' direction) from the one side 112g disposed in the −Z' direction out of the parallel sides 112e and 112g of the second excitation electrode 112. Thus, the protruding parts 111c and 111d are provided on both end parts of the first excitation electrode 111 in the Z' axis direction. The protruding parts 111c and 111d are positioned on both sides of the first excitation electrode 111 with the centroid 111a being interposed therebetween, and in this case, they are provided on both end parts of the first excitation electrode 111 in the Z' axis direction. Furthermore, the protruding parts 111c and 111d each have an outer edge shape that is not along (i.e. not in parallel with) the parallel sides 112e and 112g in plan view. In brief, the protruding parts 111c and 111d protrude outward from the part between the parallel sides 112e and 112g in plan view, and furthermore each have the outer edge shape that is not along the parallel sides 112e and 112g in the plan view. In other words, the protruding parts 111c and 111d each have the outer edge shape that is not along (i.e. not in parallel with) the X axis in plan view.

When seeing this embodiment from a different perspective, the position where the centroid (center) 111a of the first excitation electrode 111 is disposed substantially coincides with the position where the centroid (center) 112a of the second excitation electrode 112 is disposed in plan view, and furthermore the first excitation electrode 111 is disposed so as to tilt with respect to the second excitation electrode 112 in plan view. Here, the expression "dispose so as to tilt" means that one of the first excitation electrode 111 and the second excitation electrode 112 is disposed such that an outer edge thereof is tilted with respect to an outer edge of the other. Thus, the expression includes the states in which: one excitation electrode is rotated with respect to the other excitation electrode; one excitation electrode is displaced (slid) from the other excitation electrode; one excitation electrode has a part protruding from the other excitation electrode; and one excitation electrode is elongated or contracted relative to the other excitation electrode. Hereinafter, a specific description is given.

As described above, the first excitation electrode (one excitation electrode) 111 is formed so as to have a rhombus shape while the second excitation electrode (the other excitation electrode) 112 is formed so as to have a square shape. The first excitation electrode 111 has a line-symmetric shape with respect to the straight line L1 that passes through the centroid 111a of the first excitation electrode 111 and that is parallel to the X axis. The second excitation electrode 112 has a line-symmetric shape with respect to the straight line L2 that passes through the centroid 112a of the second excitation electrode 112 and that is parallel to the X axis.

The first excitation electrode 111 is disposed such that its outer edge (i.e. the four sides 111e, 111f, 111g and 111h) is tilted with respect to the outer edge of the second excitation electrode 112 (i.e. the four sides 112e, 112f, 112g and 112h). All the four sides 112e, 112f, 112g and 112h of the second excitation electrode 112 extend respectively in the direction parallel to the X axis or the Z' axis. On the other hand, all the four sides 111e, 111f, 111g and 111h of the first excitation electrode 111 do not extend in the directions parallel to the X axis and the Z' axis. All the four sides 111e, 111f, 111g and 111h of the first excitation electrode 111 extend in the directions tilted with respect to the X axis and the Z' axis.

The one side 111e of the first excitation electrode 111 is tilted by approximately 45° from the one side 112e (or the one side 112o of the second excitation electrode 112, and extends in the direction tilted with respect to the X axis and the Z' axis. The one side 111f of the first excitation electrode 111 is tilted by approximately 45° from the one side 112f (or the one side 112g) of the second excitation electrode 112, and extends in the direction tilted with respect to the X axis and the Z' axis. The one side 111g of the first excitation electrode 111 is tilted by approximately 45° from the one side 112g (or the one side 112h) of the second excitation electrode 112, and extends in the direction tilted with respect to the X axis and the Z' axis. The one side 111h of the first excitation electrode 111 is tilted by approximately 45° from the one side 112h (or the one side 112e) of the second excitation electrode 112, and extends in the direction tilted with respect to the X axis and the Z' axis.

In this embodiment, the first lead-out wiring 113 is formed on the first main surface of the support part 13 so as to be connected to the first excitation electrode 111, and the second lead-out wiring 114 is formed on the second main surface of the support part 13 so as to be connected to the second excitation electrode 112. The first lead-out wiring 113 extends in the −Z' direction from a corner part (vertex) of the first excitation electrode 111. The second lead-out wiring 114 extends in the −Z' direction from a corner part (vertex) of the second excitation electrode 112. The first lead-out wiring 113 and the second lead-out wiring 114 are formed so as to have substantially the same width. One of the first lead-out wiring 113 and the second lead-out wiring 114 is disposed so as to be displaced from the other in plan view. In this embodiment, a certain part of the first lead-out wiring 113 is superimposed on a certain part of the second lead-out wiring 114. However, the most parts of the respective first and second lead-out wirings 113 and 114 are not superimposed on each other. In the drawings, the long dashed short dashed line is used to indicate a boundary line 111b between the first excitation electrode 111 and the first lead-out wiring 113 (see FIG. 4) and a boundary line 112b between the second excitation electrode 112 and the second lead-out wiring 114 (see FIG. 5).

The protruding parts 111c and 111d are respectively formed so as to have a substantially triangle shape, and each have an outer edge shape that is not along the parallel sides 112e and 112g in plan view. More specifically, a protrusion end (an end part in the +Z' direction) of the protruding part 111c is not along the parallel side 112e in plan view and has a corner. That is, the protrusion end of the protruding part 111c is not along the X axis in plan view and has a corner. In this embodiment, the protruding part 111c is formed so as to have a substantially triangle shape, and the whole outer edge of the protruding part 111c is not along the parallel side 112e and thus is not along the X axis, in plan view.

Also, a protrusion end (an end part in the −Z' direction) of the protruding part 111d is not along the parallel side 112g in plan view and has a corner. That is, the protrusion end of the protruding part 111d is not along the X axis in plan view and has a corner. In this embodiment, the protruding part 111d is formed so as to have a substantially triangle shape, and the whole outer edge of the protruding part 111d is not along the parallel side 112g and thus is not along the X axis, in plan view.

In this embodiment, the protruding parts 111c and 111d of the first excitation electrode 111 have the respective outer edge shapes that are not along the parallel sides 112e and 112g, i.e. not along the X axis, in plan view. Thus, it is possible to reduce spurious vibration due to the outer edge shape of the first excitation electrode 111. More specifically, it is considered that spurious vibration increases because of the part along the X axis of the outer edge shape of the first excitation electrode 111. Therefore in this embodiment, the outer edge shape of each of the protruding parts 111c and 111d of the first excitation electrode 111 is made to have a shape not along the X axis so as to reduce spurious vibration caused by the outer edge shape of the first excitation electrode 111. In this way, it is possible to reduce spurious vibration and thus to improve electrical properties of the crystal resonator plate 10 having a frame body in which the vibrating part 11 is connected to the external frame part 12 via the support part 13.

Especially in the crystal resonator plate 10 having a frame body in which the vibrating part 11 is connected to the external frame part 12 via the support part 13, no mechanical and electrical connection point is directly formed on the vibrating part 11 in a process after forming the vibrating part 11, which results in no spurious vibration being generated due to formation of the connection point. That is, it is possible to further prevent spurious vibration from being generated due to the process after forming the vibrating part 11 in addition to reduction of spurious vibration by the excitation electrodes 111 and 112. Furthermore in this crystal resonator plate 10 having a frame body, since the excitation electrodes 111 and 112 can be formed on the vibrating part 11 without taking into account the connection point, it is possible to increase flexibility in the design of the excitation electrodes 111 and 112, which leads to easy adjustment of the size and the position of the electrodes. In particular, it is possible to enhance electrical properties by forming the excitation electrodes 111 and 112 having further large size, or to reduce generation of an asymmetric vibration mode that causes spurious vibration by arranging the excitation electrodes 111 and 112 such that the respective centers thereof substantially coincide with the center of the vibrating part 11 in plan view.

Unlike the conventional configurations, no support electrode for supporting the crystal resonator plate 10 is needed in the crystal resonator plate 10 having a frame body in which the vibrating part 11 is connected to the external frame part 12 via the support part 13. Thus, it is not necessary to provide any space for placing the support electrode, which makes it possible for the centroids (centers) 111a and 112a of the first and second excitation electrodes 111 and 112 to be formed close to the center of the vibrating part 11. Also in this case, since only one support part 13 is disposed in the crystal resonator plate 10, it is possible to reduce vibration leakage from the vibrating part 11 to the external frame part 12 via the support part 13 as much as possible. More specifically, the support part 13 is disposed at a corner part of the outer peripheral edge of the vibrating part 11, where displacement of the piezoelectric vibration is relatively small. Accordingly, it is possible to prevent the piezoelectric vibration from leaking to the external frame part 12 via the support part 13 in comparison with the case in which the support part 13 is disposed in a part other than the corner parts (e.g. a middle part of the side). Thus, the vibrating part 11 can be piezoelectrically vibrated further effectively, which leads to improvement of the electrical properties. Furthermore, compared to the configuration in which two or more support parts 13 are disposed, it is possible to reduce a stress applied to the vibrating part 11, which results in reduction in frequency shift of the piezoelectric vibration due to the stress. Thus, stability of the piezoelectric vibration can be improved.

Also in this embodiment, since the first excitation electrode 111 is disposed so as to tilt with respect to the second excitation electrode 112 in plan view, it is possible to reduce spurious vibration due to the outer edge shape of the first excitation electrode 111. More specifically, it is considered that spurious vibration increases because of the part of the outer edge shape of the first excitation electrode 111 that is along the outer edge shape of the second excitation electrode 112. Therefore in this embodiment, the four sides 111e, 111f, 111g and 111h of the first excitation electrode 111 are disposed so as to tilt with respect to the four sides 112e, 112f, 112g and 112h of the second excitation electrode 112 so as to reduce spurious vibration caused by the outer edge shape of the first excitation electrode 111. In this way, it is possible to reduce spurious vibration and thus to improve electrical properties of the crystal resonator plate 10 having a frame body in which the vibrating part 11 is connected to the external frame part 12 via the support part 13.

Especially in the crystal resonator plate 10 having a frame body in which the vibrating part 11 is connected to the external frame part 12 via the support part 13, no mechanical and electrical connection point is directly formed on the vibrating part 11 in a process after forming the vibrating part 11, which results in no spurious vibration being generated due to formation of the connection point. That is, it is possible to further prevent spurious vibration from being generated due to the process after forming the vibrating part 11 in addition to reduction of spurious vibration by the excitation electrodes 111 and 112. Furthermore in this crystal resonator plate 10 having a frame body, since the excitation electrodes 111 and 112 can be formed on the vibrating part 11 without taking into account the connection point, it is possible to increase flexibility in the design of the excitation electrodes 111 and 112, which leads to easy adjustment of the size and the position of the electrodes. In particular, it is possible to enhance electrical properties by forming the excitation electrodes 111 and 112 having further large size, or to reduce generation of an asymmetric vibration mode that causes spurious vibration by arranging the excitation electrodes 111 and 112 such that the respective centers thereof substantially coincide with the center of the vibrating part 11 in plan view.

Also in this embodiment, the protruding parts 111c and 111d are positioned on both sides of the first excitation electrode 111 with the centroid 111a being interposed therebetween. Furthermore, the protruding parts 111c and 111d each have an outer edge shape that is not along the outer edge of the second excitation electrode 112 and not along the X axis in plan view. Thus, it is possible to reduce spurious vibration due to the outer edge shape of the first excitation electrode 111. More specifically, it is considered that spurious vibration increases because of the part along the X axis of the outer edge shape of the first excitation electrode 111. Therefore in this embodiment, the outer edge shape of each of the protruding parts 111c and 111d of the first excitation electrode 111 is made to have a shape not along the X axis so as to reduce spurious vibration caused by the outer edge shape of the first excitation electrode 111.

Here, the second excitation electrode 112 is formed so as to have a rectangle shape while the first excitation electrode 111 is formed so as to have a rhombus shape. Thus, the whole outer edge of the first excitation electrode 111 (i.e. the four sides 111e, 111f, 111g and 111h) is not along the four sides 112e, 112f, 112g and 112h of the second excitation electrode 112 and not along the X axis in plan view. In this way, it is possible further effectively reduce spurious vibration due to the outer edge shape of the first excitation electrode 111.

Conventionally in the crystal resonator plate 10 having a frame body in which the vibrating part 11 is connected to the external frame part 12 via the support part 13, the first excitation electrode and the second excitation electrode are formed so as to have substantially the same shape (principally, a rectangle shape) and furthermore to locate at substantially the same position in plan view. However, by forming the second excitation electrode 112 having a rectangle shape, frequency adjustment of the crystal resonator plate 10 can be performed using masks and jigs for rectangle electrodes, similarly to the conventional cases. Thus, this configuration has an advantage in frequency adjustment.

The position where the centroid 111a of the first excitation electrode 111 is disposed substantially coincides with the position where the centroid 112a of the second excitation electrode 112 is disposed in plan view. Thus, the protruding parts 111c and 111d that are provided on both end parts of the first excitation electrode 111 in the Z' axis direction can be formed so as to have a line-symmetric shape with respect to the straight line L1 that passes through the centroid 111a of the first excitation electrode 111 and that is parallel to the X axis (i.e. the parallel sides 112e and 112g). In this way, it is possible to reduce spurious vibration derived from asymmetry between the protruding parts 111c and 111d of the first excitation electrode 111.

Also, since the area of the second excitation electrode 112 is larger than the area of the first excitation electrode 111, the frequency of the crystal resonator plate 10 can be easily adjusted by performing, for example, ion beam etching on the second excitation electrode 112 having a larger area. That is, the second excitation electrode 112 having a larger area can be used as an electrode for frequency adjustment. Conventionally in the crystal resonator plate 10 having a frame body in which the vibrating part 11 is connected to the external frame part 12 via the support part 13, the first excitation electrode and the second excitation electrode are formed so as to have substantially the same shape (principally, a rectangle shape) and furthermore to locate at substantially the same position in plan view, as described above. However, by forming the first excitation electrode 111 and the second excitation electrode 112 so as to have respectively different areas, a region for frequency adjustment can be ensured on the larger second excitation electrode 112, thus this configuration has an advantage in frequency adjustment of the crystal resonator plate 10. When the area of the second excitation electrode 112 is smaller than the area of the first excitation electrode 111, the CI value at ambient temperature of the crystal resonator plate 10 may rise or the CI value may unstably change depending on temperature change. However, by forming the area of the second excitation electrode 112 larger than the area of the first excitation electrode 111, it is possible to maintain good properties (e.g. the CI value at ambient temperature and temperature properties of the CI value) of the crystal resonator plate 10.

The first lead-out wiring 113 and the second lead-out wiring 114 extend in the same direction and furthermore one of these lead-out wirings is arranged so as to be displaced from the other in plan view. The part where the first and second lead-out wirings 113 and 114 are superimposed on each other may generate vibration, which may lead to vibration leakage to the external frame part 12. Therefore, by reducing the part where the first and second lead-out wirings 113 and 114 are superimposed on each other as much as possible, it is possible to reduce the vibration generated in the first and second lead-out wirings 113 and 114, which leads to prevention of vibration leakage to the external frame part 12. In this embodiment, the first lead-out wiring 113 and the second lead-out wiring 114 extend in the −Z' direction from the respective corner parts (vertices) of the first excitation electrode 111 and the second excitation electrode 112. Thus, the first and second lead-out wirings 113 and 114 can be easily disposed so as to be displaced from each other. Furthermore, since the first and second lead-out wirings 113 and 114 extend in the same direction, it is possible to simplify the first and second lead-out wirings 113 and 114 as well as wirings to be connected to the first and second lead-out wirings 113 and 114, compared to the case in which the first and second lead-out wirings 113 and 114 extend respectively in the different directions. As a result, no complicated wiring is required, which contributes to size reduction of the crystal resonator plate 10.

The crystal resonator 100 including the above-described crystal resonator plate 10 can also achieve functions and effects similar to those of the crystal resonator plate 10.

The above-disclosed embodiment is to be considered in all respects as illustrative and not limiting. The technical scope of the invention is indicated by the appended claims rather than by the foregoing embodiment, and all modifications and changes that come within the meaning and range of equivalency of the claims are intended to be embraced therein.

In the above-described embodiment, the first excitation electrode 111 having a rhombus shape is formed on the first main surface 101 of the crystal resonator plate 10, and the second excitation electrode 112 having a rectangle shape is formed on the second main surface 102 of the crystal resonator plate 10. However, the first excitation electrode 111 having a rectangle shape may be formed on the first main surface 101 of the crystal resonator plate 10, and the second excitation electrode 112 having a rhombus shape may be formed on the second main surface 102 of the crystal resonator plate 10. In this case, it is sufficient that the protruding parts provided on both end parts of the second excitation electrode 112 in the Z' axis direction each have an outer edge shape that is not along the parallel sides of the first excitation electrode 111 in plan view.

It should be noted that each shape and position of the following elements are exemplarily shown and can be changed in various manners: the first and second excitation electrodes 111 and 112; the protruding parts 111c and 111d of the first excitation electrode 111; and the first and second lead-out wirings 113 and 114. The first excitation electrode 111 may have a shape other than the rhombus shape. For example, it may have a rectangle shape, a parallelogram shape, an ellipse shape; an elongated circle shape, a hexagon shape, and an octagon shape. The second excitation electrode 112 may have a shape other than the rectangle shape. For example, it may have a parallelogram shape, an ellipse shape; an elongated circle shape, a hexagon shape, and an octagon shape. The protruding parts 111c and 111d of the first excitation electrode 111 may each have a shape other than the triangle shape. For example, they may each have a semi-circular shape.

The position where the centroid 111a of the first excitation electrode 111 is disposed is not necessarily required to substantially coincide, in plan view, with the position where the centroid 112a of the second excitation electrode 112 is disposed. The first excitation electrode 111 is not necessarily required to have a line-symmetric shape with respect to the straight line L1 that passes through the centroid 111a of the first excitation electrode 111 and that is parallel to the X axis.

The second excitation electrode 112 is not necessarily required to have a line-symmetric shape with respect to the straight line L2 that passes through the centroid 112a of the second excitation electrode 112 and that is parallel to the X axis.

It is sufficient that the protrusion end of the protruding part 111c of the first excitation electrode 111 is not along the parallel side 112e and the X axis in plan view. The whole outer edge of the protruding part 111c is not necessarily required not to be along the parallel side 112e in plan view. It is sufficient that the protrusion end of the protruding part 111d of the first excitation electrode 111 is not along the parallel side 112g and the X axis in plan view. The whole outer edge of the protruding part 111d is not necessarily required not to be along the parallel side 112g in plan view. The protrusion ends of the protruding parts 111c and 111d of the first excitation electrode 111 may each have an R shape.

The parallel sides 112e and 112g of the second excitation electrode 112 are not necessarily required to be along the X axis. The protruding part may be provided only on one end of both end parts of the first excitation electrode 111 in the Z' axis direction. Also, more than two protruding parts of the first excitation electrode 111 may be provided. In these cases, it is sufficient that each protrusion end of the protruding parts of the first excitation electrode 111 has the outer edge shape that is not along the parallel sides of the excitation electrode 112 and the X axis in plan view.

In the above-described embodiment, the four sides 111e, 111f, 111g and 111h of the first excitation electrode 111 are disposed so as to tilt with respect to the four sides 112e, 112f, 112g and 112h of the second excitation electrode 112 so that the protruding parts 111c and 111d are formed. However, the first and second excitation electrodes 111 and 112 may be formed so as to have the same shape (for example, a square shape, a rhombus shape and an ellipse shape), and thus one excitation electrode of the first and second excitation electrodes 111 and 112 may be rotated, with respect to the other excitation electrode, about the centroid 111a of the first excitation electrode 111. For example, the first and second excitation electrodes 111 and 112 are each formed so as to have a square shape, and furthermore the first excitation electrode 111 may be rotated about the centroid 111a of the first excitation electrode 111 relative to the second excitation electrode 112. In this case, the first and second excitation electrodes 111 and 112 may be similar to each other.

Alternatively, the first and second excitation electrodes 111 and 112 may be formed so as to have the same shape (for example, a square shape, a rhombus shape and an ellipse shape), and thus one excitation electrode of the first and second excitation electrodes 111 and 112 may be scaled (i.e. elongated or contracted) in the X axis direction or the Z' axis direction relative to the other excitation electrode.

The entire first lead-out wiring 113 is not necessarily required to completely superimpose on the entire second lead-out wiring 114 in plan view. The first lead-out wiring 113 and the second lead-out wiring 114 may extend in the different directions from each other. In the above-described embodiment, the first lead-out wiring 113 and the second lead-out wiring 114 extend from the respective corner parts (vertices) of the first excitation electrode 111 and the second excitation electrode 112. However, the present invention is not limited thereto. The first lead-out wiring 113 and the second lead-out wiring 114 may extend, respectively, from a middle part of one side out of the four sides of the first lead-out wiring 111 and a middle part of one side out of the four sides of the second excitation electrode 112.

Also, the crystal resonator plate 10 may include two or more support parts 13 that connect the vibrating part 11 to the external frame part 12.

In the above-described embodiment, the present invention is applied to the crystal resonator 100. However, the present invention is not limited thereto. For example, the present invention may be applied to a crystal oscillator.

In the above-described embodiment, the first sealing member 20 and the second sealing member 30 are each made of a crystal plate. However, the present invention is not limited thereto. The first sealing member 20 and the second sealing member 30 may be made of, for example, glass.

This application claims priority based on Patent Application No. 2019-102950 filed in Japan on May 31, 2019, Patent Application No. 2019-102951 filed in Japan on May 31, 2019, and Patent Application No. 2019-115542 filed in Japan on Jun. 21, 2019. The entire contents thereof are hereby incorporated in this application by reference.

DESCRIPTION OF REFERENCE NUMERALS

10 Crystal resonator plate (piezoelectric resonator plate)
11 Vibrating part
12 External frame part
13 Support part
20 First sealing member
30 Second sealing member
100 Crystal resonator (piezoelectric resonator device)
111 First excitation electrode (one excitation electrode)
111a Centroid
111c, 111d Protruding part
112 Second excitation electrode (other excitation electrode)
112a Centroid
112e, 112g Parallel side
L1, L2 Straight line

The invention claimed is:
1. A piezoelectric resonator plate that operates in a thickness shear vibration mode, comprising:
   a vibrating part;
   an external frame part surrounding an outer periphery of the vibrating part;
   a support part connecting the vibrating part to the external frame part;
   a cutout part formed between the vibrating part and the external frame part by cutting out the piezoelectric resonator plate;
   a first excitation electrode formed on a first main surface of the vibrating part;
   a second excitation electrode formed on a second main surface of the vibrating part, the second excitation electrode making a pair with the first excitation electrode;
   a first lead-out wiring formed on the first main surface of the vibrating part and drawn from the first excitation electrode through the support part to the external frame part; and
   a second lead-out wiring formed on the second main surface and drawn from the first excitation electrode through the support part to the external frame part, wherein
   one excitation electrode of the first excitation electrode and the second excitation electrode includes at least one protruding part, other than the first and second lead-out wirings, that protrudes with respect to the other exci- tation electrode of the first excitation electrode and the second excitation electrode within the vibrating part in plan view, the other excitation electrode includes at least one pair of parallel sides parallel to each other, the at least one protruding part protrudes outward from a part between the pair of parallel sides within the vibrating part in plan view, and furthermore has an outer edge shape that is not along the pair of parallel sides within the vibrating part in plan view, the vibrating part is configured such that no mechanical connection point and no electrical connection point are directly formed thereon, the first lead-out wiring extends from a corner part of the first excitation electrode, and a connection part of the first lead-out wiring and the first excitation electrode is not superimposed on the second lead-out wiring and the second excitation electrode in plan view, and the second lead-out wiring extends from a corner part of the second excitation electrode, and a connection part of the second lead-out wiring and the second excitation electrode is not superimposed on the first lead-out wiring and the first excitation electrode in plan view.

2. The piezoelectric resonator plate according to claim 1, wherein
a position where a centroid of the one excitation electrode is disposed substantially coincides with a position where a centroid of the other excitation electrode is disposed in plan view.

3. The piezoelectric resonator plate according to claim 1, wherein
an area of the other excitation electrode is larger than an area of the one excitation electrode.

4. The piezoelectric resonator plate according to claim 1, wherein
the first lead-out wiring and the second lead-out wiring extend in a same direction.

5. The piezoelectric resonator plate according to claim 4, wherein
one lead-out wiring of the first lead-out wiring and the second lead-out wiring is disposed so as to be displaced from the other lead-out wiring of the first lead-out wiring and the second lead-out wiring in plan view.

6. The piezoelectric resonator plate according to claim 1, wherein
the one excitation electrode is formed so as to have a rhombus shape, and
the other excitation electrode is formed so as to have a rectangle shape.

7. The piezoelectric resonator plate according to claim 1, wherein
the piezoelectric resonator plate includes only one support part.

8. A piezoelectric resonator device including the piezoelectric resonator plate according to claim 1, comprising:
a first sealing member covering the first excitation electrode of the piezoelectric resonator plate; and
a second sealing member covering the second excitation electrode of the piezoelectric resonator plate, wherein
the vibrating part of the piezoelectric resonator plate is hermetically sealed by bonding the first sealing member to the piezoelectric resonator plate and by bonding the second sealing member to the piezoelectric resonator plate.

9. The piezoelectric resonator plate according to claim 1, wherein
the cutout part surrounds the entire periphery of the vibrating part except for the support part in plan view.

10. A piezoelectric resonator plate that operates in a thickness shear vibration mode, comprising:
a vibrating part;
an external frame part surrounding an outer periphery of the vibrating part;
a support part connecting the vibrating part to the external frame part;
a cutout part formed between the vibrating part and the external frame part by cutting out the piezoelectric resonator plate;
a first excitation electrode formed on a first main surface of the vibrating part;
a second excitation electrode formed on a second main surface of the vibrating part, the second excitation electrode making a pair with the first excitation electrode;
a first lead-out wiring formed on the first main surface of the vibrating part and drawn from the first excitation electrode through the support part to the external frame part; and
a second lead-out wiring formed on the second main surface and drawn from the first excitation electrode through the support part to the external frame part, wherein
the first excitation electrode and the second excitation electrode are each formed within the vibrating part to have a line-symmetric shape with respect to a straight line parallel to an X axis of the piezoelectric resonator plate,
one excitation electrode of the first excitation electrode and the second excitation electrode includes at least one protruding part, other than the first and the second lead-out wirings, that protrudes outward without being superimposed on the other excitation electrode of the first excitation electrode and the second excitation electrode within the vibrating part in plan view,
the at least one protruding part has an outer edge shape that is not along the X axis within the vibrating part in plan view, and
the vibrating part is configured such that no mechanical connection point and no electrical connection point are directly formed thereon,
the first lead-out wiring extends from a corner part of the first excitation electrode, and a connection part of the first lead-out wiring and the first excitation electrode is not superimposed on the second lead-out wiring and the second excitation electrode in plan view, and
the second lead-out wiring extends from a corner part of the second excitation electrode, and a connection part of the second lead-out wiring and the second excitation electrode is not superimposed on the first lead-out wiring and the first excitation electrode in plan view.

11. The piezoelectric resonator plate according to claim 10, wherein
the cutout part surrounds the entire periphery of the vibrating part except for the support part in plan view.

12. A piezoelectric resonator plate that operates in a thickness shear vibration mode, comprising:
a vibrating part;
an external frame part surrounding an outer periphery of the vibrating part;
a support part connecting the vibrating part to the external frame part;

a cutout part formed between the vibrating part and the external frame part by cutting out the piezoelectric resonator plate;

a first excitation electrode formed on a first main surface of the vibrating part;

a second excitation electrode formed on a second main surface of the vibrating part, the second excitation electrode making a pair with the first excitation electrode;

a first lead-out wiring formed on the first main surface of the vibrating part and drawn from the first excitation electrode through the support part to the external frame part; and a second lead-out wiring formed on the second main surface and drawn from the first excitation electrode through the support part to the external frame part, wherein a position where a centroid of the first excitation electrode is disposed substantially coincides with a position where a centroid of the second excitation electrode is disposed in plan view, one excitation electrode of the first excitation electrode and the second excitation electrode is disposed so as to tilt with respect to the other excitation electrode of the first excitation electrode and the second excitation electrode within the vibrating part in plan view, the vibrating part is configured such that no mechanical connection point and no electrical connection point are directly formed thereon, the first lead-out wiring extends from a corner part of the first excitation electrode, and a connection part of the first lead-out wiring and the first excitation electrode is not superimposed on the second lead-out wiring and the second excitation electrode in plan view, and the second lead-out wiring extends from a corner part of the second excitation electrode, and a connection part of the second lead-out wiring and the second excitation electrode is not superimposed on the first lead-out wiring and the first excitation electrode in plan view.

13. The piezoelectric resonator plate according to claim 12, wherein protruding parts are respectively provided on both sides of the one excitation electrode with the centroid of the first excitation electrode being interposed between both the sides such that the protruding parts protrude outward without being superimposed on the other excitation electrode in plan view, and the protruding parts each have an outer edge shape that is not along an outer edge of the other excitation electrode in plan view.

14. The piezoelectric resonator plate according to claim 12, wherein the cutout part surrounds the entire periphery of the vibrating part except for the support part in plan view.

* * * * *